United States Patent
Radovanov et al.

(10) Patent No.: US 8,481,960 B2
(45) Date of Patent: Jul. 9, 2013

(54) DECELERATION LENS

(75) Inventors: Svetlana Radovanov, Marblehead, MA (US); Jason Schaller, Austin, TX (US); Richard White, Newmarket, NH (US); Kevin Verrier, Newmarket, NH (US); James Blanchette, Haverhill, MA (US); Bon-Woong Koo, Andover, MA (US); Eric Hermanson, Georgetown, MA (US); Kevin Daniels, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 175 days.

(21) Appl. No.: 13/167,399

(22) Filed: Jun. 23, 2011

(65) Prior Publication Data

US 2012/0001087 A1  Jan. 5, 2012

Related U.S. Application Data

(60) Provisional application No. 61/359,048, filed on Jun. 28, 2010, provisional application No. 61/405,886, filed on Oct. 22, 2010.

(51) Int. Cl.
*G21K 1/08* (2006.01)
*H01J 3/14* (2006.01)
*H01J 3/26* (2006.01)
*H01J 49/42* (2006.01)

(52) U.S. Cl.
USPC ............ 250/396 R; 250/492.21; 250/492.23; 250/326 R; 250/423 R; 250/492.1; 250/492.2

(58) Field of Classification Search
USPC .................. 250/396 R, 492.1, 492.2, 492.21, 250/492.23, 326 R, 423 R
See application file for complete search history.

(56) References Cited

U.S. PATENT DOCUMENTS

| | | | |
|---|---|---|---|
| 5,393,984 A | 2/1995 | Glavish | |
| 5,481,116 A | 1/1996 | Glavish et al. | |
| 5,932,882 A * | 8/1999 | England et al. | 250/492.21 |
| 6,639,227 B1 | 10/2003 | Glavish et al. | |
| 7,279,687 B2 | 10/2007 | Angel et al. | |
| 7,339,179 B2 | 3/2008 | Radovanov et al. | |
| 7,675,047 B2 | 3/2010 | Radovanov et al. | |
| 2007/0108390 A1 * | 5/2007 | Radovanov et al. | 250/396 R |

FOREIGN PATENT DOCUMENTS

JP  1265439 A  10/1989

* cited by examiner

*Primary Examiner* — Jack Berman
*Assistant Examiner* — Meenakshi Sahu

(57) ABSTRACT

A system and method are disclosed for controlling an ion beam. A deceleration lens is disclosed for use in an ion implanter. The lens may include a suppression electrode, first and second focus electrodes, and first and second shields. The shields may be positioned between upper and lower portions of the suppression electrode. The first and second shields are positioned between the first focus electrode and an end station of the ion implanter. Thus positioned, the first and second shields protect support surfaces of said first and second focus electrodes from deposition of back-streaming particles generated from said ion beam. In some embodiments, the first and second focus electrodes may be adjustable to enable the electrode surfaces to be adjusted with respect to a direction of the ion beam. By adjusting the angle of the focus electrodes, parallelism of the ion beam can be controlled. Other embodiments are described and claimed.

20 Claims, 14 Drawing Sheets

DECELERATION LENS

CROSS-REFERENCE TO RELATED APPLICATIONS

This is a non-provisional of pending U.S. Provisional Patent Application Ser. No. 61/359,048, filed Jun. 28, 2010, and a non-provisional of pending U.S. Provisional Patent Application Ser. No. 61/405,886, filed Oct. 22, 2010, the entirety of which provisional applications are incorporated by reference herein in their entirety.

BACKGROUND OF THE INVENTION

1. Field of the Invention

Embodiments relate to the field of device manufacturing. More particularly, the present disclosure relates to an improved deceleration lens used in ion implanters.

2. Discussion of Related Art

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of devices that employ silicon workpieces. Any reduced cost in the manufacture or production of high-performance solar cells or any efficiency improvement to high-performance solar cells would have a positive impact on the implementation of solar cells which would enhance the wider availability of this clean energy technology.

Some ion implantation processes decelerate the ions prior to implantation. Deceleration is typically performed by applying different combinations of voltage potentials to electrodes disposed on opposite sides of the ion beam. By manipulating the voltage potentials, ion energy can be reduced to a desired level, causing the ion beam to "decelerate." This allows the ions to be transported at high speed until just prior to implant. Since implant depth is proportional to ion energy, deceleration is often required when forming devices with shallower junction depths.

Such deceleration, however, may lead to energy contamination, which can occur when high-speed neutral particles are formed. Neutral particles are not affected by a deceleration lens because they lack a charge. The neutral particles may form through interactions between ions or interactions between ions and other particles in the implanter. Some workpieces, such as semiconductor wafers, are sensitive to energy contamination because high-speed neutral particles can implant deep into the crystal lattice of the semiconductor wafer. Other workpieces, such as solar cells, are less sensitive to energy contamination. This is because solar cell junctions are substantially deeper than typical semiconductor logic devices, and as such, energy contamination from the implant doesn't affect the final implant profile, subsequent to annealing. Implantation of solar cells may involve high throughput of workpieces at ion beam energies of approximately 1 keV to 10 keV. A deceleration lens is one component in an implanter that may enable high throughputs at these beam energies. Some deceleration lenses may use segmented lenses with adjustable z-positions, which may require multiple power supplies, complicated moving parts, and may be prone to particle deposition on various components.

Deposition of particles on implanter components such as the deceleration lens, can cause a variety of operational problems. Back-streaming particles are one example of particles that may be deposited on surfaces of the deceleration lens that are exposed to, or are in, the ion beam line-of-sight. Back-streaming particles are generated when the ion beam hits the wafer or areas of the ion implanter that are exposed to the ion beam. The impact sputters ions and neutral particles off the impact surfaces, causing the particles to stream back toward the deceleration lens. In one instance, back-streaming particles can be deposited on surfaces of the lens insulators, where the maximum voltage difference is 35 kV for a 2:1 or 3:1 deceleration ratio (such as going from 30 keV to 10 keV). Back-streaming particles also can be deposited on lens bushing plates where the maximum voltage difference across the insulator is 20 kV for a 2:1 or 3:1 deceleration ratio. Any deposition on an insulating surface can reduce the mean time between failures (MTBF) to below-specification levels. When particles deposit on a deceleration lens, glitching which is the sudden transient in beam current, may occur. In addition, high-voltage breakdown of the deceleration lens can occur. High-voltage breakdown is caused when back-streaming particles are deposited on only one side of the lens insulators (i.e., the side facing the end station), thus reducing the insulators' ability to sustain the voltage difference between the electrode and ground. Each of these conditions can adversely affect precise dose control and dose uniformity of the implanted species on a target substrate. Thus, there remains a need for an improved deceleration lens that alleviates the aforementioned problems. The improved deceleration lens should include features that reduce particle buildup on lens surfaces during ion implant operations.

SUMMARY OF THE INVENTION

A deceleration lens is disclosed for use in an ion implanter. The lens may comprise a suppression electrode having an upper portion and a lower portion. The upper and lower portions may be disposed such that an ion beam is transmitted therebetween. The lens may further include first and second focus electrodes positioned between the upper and lower portions of the suppression electrode, wherein the first and second focus electrodes are disposed such that the ion beam is transmitted therebetween. The lens may also include first and second shields, where the first shield is disposed between the first focus electrode and an end station of the ion implanter, and the second shield is disposed between the second focus electrode and the end station of the ion implanter. The first and second shields may protect support surfaces of said first and second focus electrodes from deposition of back-streaming particles generated from said ion beam.

A deceleration lens is disclosed for use in an ion implanter. The lens may comprise a suppression electrode having upper and lower portions positioned to enable an ion beam to be transmitted therebetween, and first and second focus electrodes positioned between the upper and lower portions of the suppression electrode. The first and second focus electrodes may be positioned to enable the ion beam to be transmitted therebetween. The first and second focus electrodes may also each having electrode surfaces facing the ion beam. The first and second focus electrodes may be adjustable to enable the electrode surfaces to form an oblique angle with respect to a transmission direction of the ion beam.

A deceleration lens is disclosed for use in an ion implanter. The deceleration lens can include a suppression electrode having upper and lower portions positioned to enable an ion beam to be transmitted therebetween. First and second focus electrodes may be positioned between the upper and lower portions of the suppression electrode, the first and second focus electrodes positioned to enable the ion beam to be transmitted therebetween. The first and second focus electrodes may each have electrode surfaces facing the ion beam. A conductive feedthrough sheath can be disposed between the suppression electrode and an upper portion of the deceleration lens, the conductive feedthrough sheath being supported by standoffs from a surrounding vacuum chamber. The first and second focus electrodes may be supported by insulators attached to the suppression electrode. The suppression electrode is supported by a plurality of high voltage feedthrough supports engaged with a lid portion of the deceleration lens. The feedthrough sheath may operate at ground potential and may provide ground plane symmetry about the ion beam.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Figure 1:
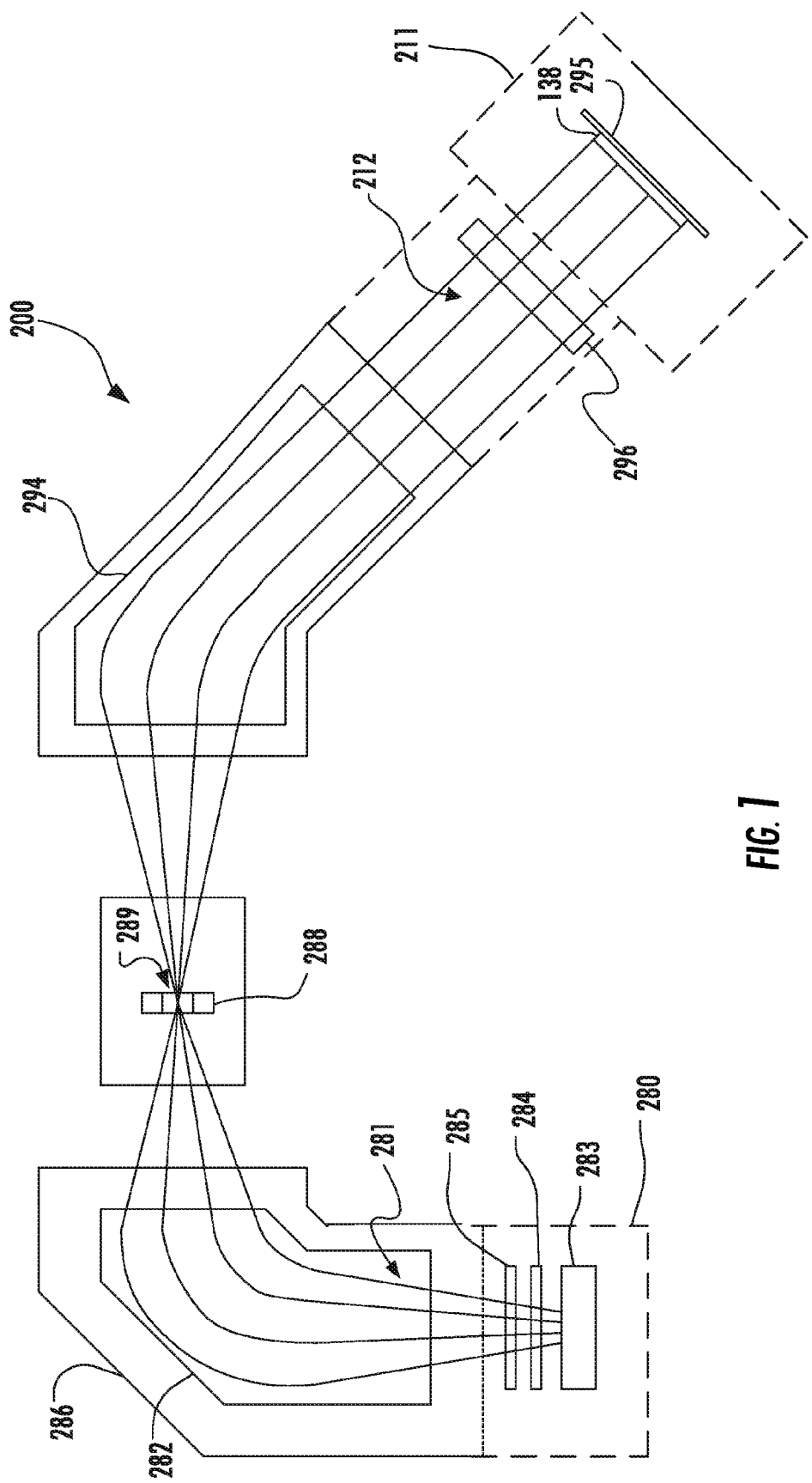
FIG. 1 is a block diagram of a beam-line ion implanter.

The deceleration lens is described herein in connection with an ion implanter. While ion implantation of solar cells is specifically mentioned, the implanter can be used with other workpieces such as, for example, semiconductor wafers, flat panels, or light-emitting diodes (LEDs). Thus, the invention is not limited to the specific embodiments described below. FIG. 1 is a block diagram of a beam-line ion implanter 200. In one instance, this implanter 200 may be for doping a semiconductor wafer. Those skilled in the art will recognize that the beam-line ion implanter 200 is only one of many examples of beam-line ion implanters that can produce ions. Thus, the deceleration lens described herein is not limited solely to the beam-line ion implanter 200 of FIG. 1. In general, the beam-line ion implanter 200 includes an ion source 280 to generate ions for forming an ion beam 281. The ion source 280 may include an ion chamber 283 where a feed gas supplied to the ion chamber 283 is ionized. This gas may be or may include or contain hydrogen, helium, other rare gases, oxygen, nitrogen, arsenic, boron, phosphorus, aluminum, indium antimony, carborane, alkanes, another large molecular compound, or other p-type or n-type dopants. The generated ions may be extracted from the ion chamber 283 by a series of extraction electrodes to form ion beam 281. In particular, the ions may be extracted from chamber 283 by an extraction electrode part of which is formed by the exit aperture of chamber 283, suppression electrode 284 and ground electrode 285. The ion beam 281 is mass analyzed by mass analyzer 286 which includes a resolving magnet 282 and a masking electrode 288 having a resolving aperture 289. The resolving magnet 282 deflects ions in the ion beam 281 such that only ions having a desired mass to charge ratio associated with a particular dopant ion species pass through resolving aperture 289. The undesired ion species do not pass through the resolving aperture 289, since they are blocked by the masking electrode 288.

Ions of the desired ion species pass through resolving aperture 289 to the angle corrector magnet 294. The angle corrector magnet 294 deflects ions of the desired ion species and converts the ion beam from a diverging ion beam to ribbon ion beam 212, which has substantially parallel ion trajectories. The beam-line ion implanter 200 may further include acceleration and/or deceleration units in some embodiments. Acceleration and deceleration units are used in ion implant systems to speed up or slow down the ion beam. Speed adjustment is accomplished by applying specific combinations of voltage potentials to sets of electrodes disposed on opposite sides of the ion beam. As the ion beam passes between the electrodes, ion energies are increased or decreased depending on the applied voltage potentials. Since the depth of an ion implant is proportional to the energy of the impinging ion beam, beam acceleration may be desirable when performing deep ion implants. Conversely, where shallow ion implants are desired, beam deceleration is performed to ensure the impinging ions travel only a short distance into the workpiece. The illustrated embodiment includes a deceleration unit 296.

An end station 211 includes a platen 295 configured to support one or more workpieces, such as workpiece 138, which is disposed in the path of ribbon ion beam 212, such that ions of the desired species are implanted into the workpiece 138. The workpiece 138 may be, for example, a semiconductor wafer, solar cell, etc. The end station 211 also may include a scanner (not shown) for moving the workpiece 138 perpendicular to the long dimension of the ribbon ion beam 212 cross-section, thereby distributing ions over the entire surface of the workpiece 138. Although a ribbon ion beam 212 is illustrated, other embodiments may provide a spot beam. It will be understood to those skilled in the art that the entire path traversed by the ion beam is evacuated during ion implantation. The beam-line ion implanter 200 may also include additional components known to those skilled in the art and may incorporate hot or cold implantation of ions in some embodiments.

The depth of ion implantation into the workpiece 138 is based on the ion implant energy and ion mass. Smaller electronic device sizes require high beam current densities implanted at low energy levels (for example $\leq 2$ keV). When the workpiece 138 is a solar cell, the ribbon beam 212 may be implanted at a high beam current and at energies of approximately 1 to 10 keV. To accomplish this, process-chamber-deceleration (PCD) mode is used where the ion beam 281 and ribbon ion beam 212 are transported at relatively high energy through the beam-line ion implanter 200 and decelerated upstream from the end station 211 using the one or more deceleration units 296. For example, ribbon ion beam 212 may be transported trough implanter 200 at energies of 30 keV to 50 keV prior to deceleration by deceleration unit 296.

For solar cells, the ribbon ion beam 212 is transported at maximum energy up to the deceleration unit 296 where the ions are decelerated to the desired energy just before end station 211. For example, the ribbon ion beam 212 may have an energy of 30 keV before deceleration unit 296 and 10 keV after the deceleration unit 296. This is referred to as a 3:1 deceleration ratio. Higher deceleration ratios of, e.g., 4:1 or even 50:1 may be possible depending on the desired implantation depth and the particular implant process.

Figure 2:
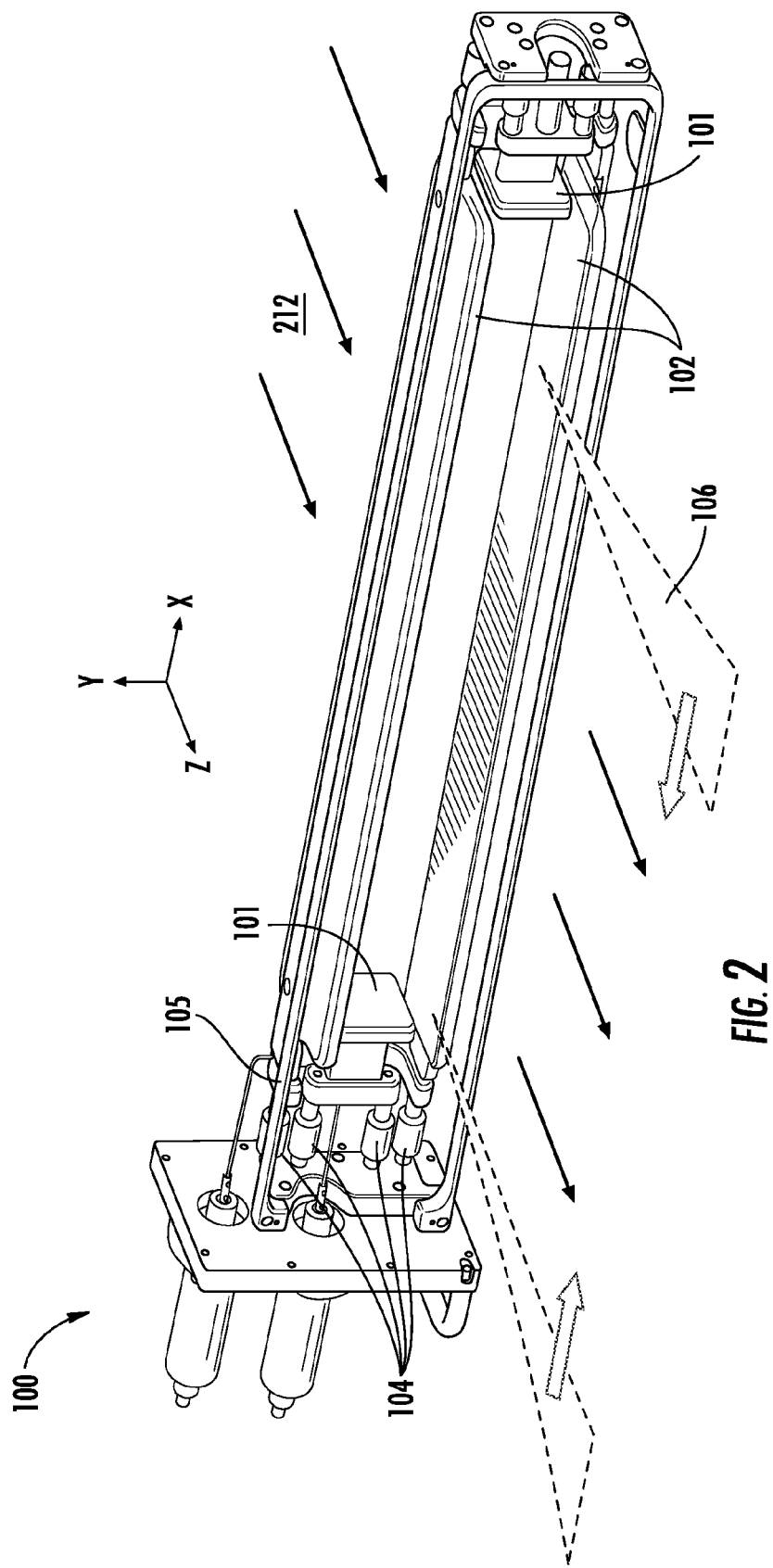
FIG. 2 is a perspective view of an exemplary deceleration lens.

FIG. 2 is a perspective view of an exemplary deceleration lens 100 which may be or be part of deceleration unit 296 (shown in FIG. 1). Deceleration lens 100 includes suppression electrodes 102, focus lenses 101, supporting insulators 104, and a bushing plate 103 (see FIGS. 14 and 15) that is at least partly disposed around ribbon beam 212. A decel frame 105 at least partly supports the aforementioned components of the deceleration lens 100. As is depicted, beam 212 travels in the z direction and has a width in the x direction and a height in the y direction. Deceleration of the ions causes the beam 212 to expand in the x-direction, which results in beam current loss illustrated by the beam lost section 106. This expansion of the beam is caused, at least in part, by aberrations in the equipotentials at the edges of the electrodes, which can distort or spread the beam shape. Expansion is also caused by the space charge effect associated with low energy ion beams. Specifically, low energy ion beams tend to diverge as they decelerate, as positively charged ions in the beam repel each other. This causes the beam to diverge from the beamline path. The focus lenses 101 may act as an electrostatic quadrupole that focuses or defocuses the ribbon beam 212 in the x-direction. Each focus lens 101 may be independently biased to optimize the shape of the ribbon beam 212.

Figure 3:
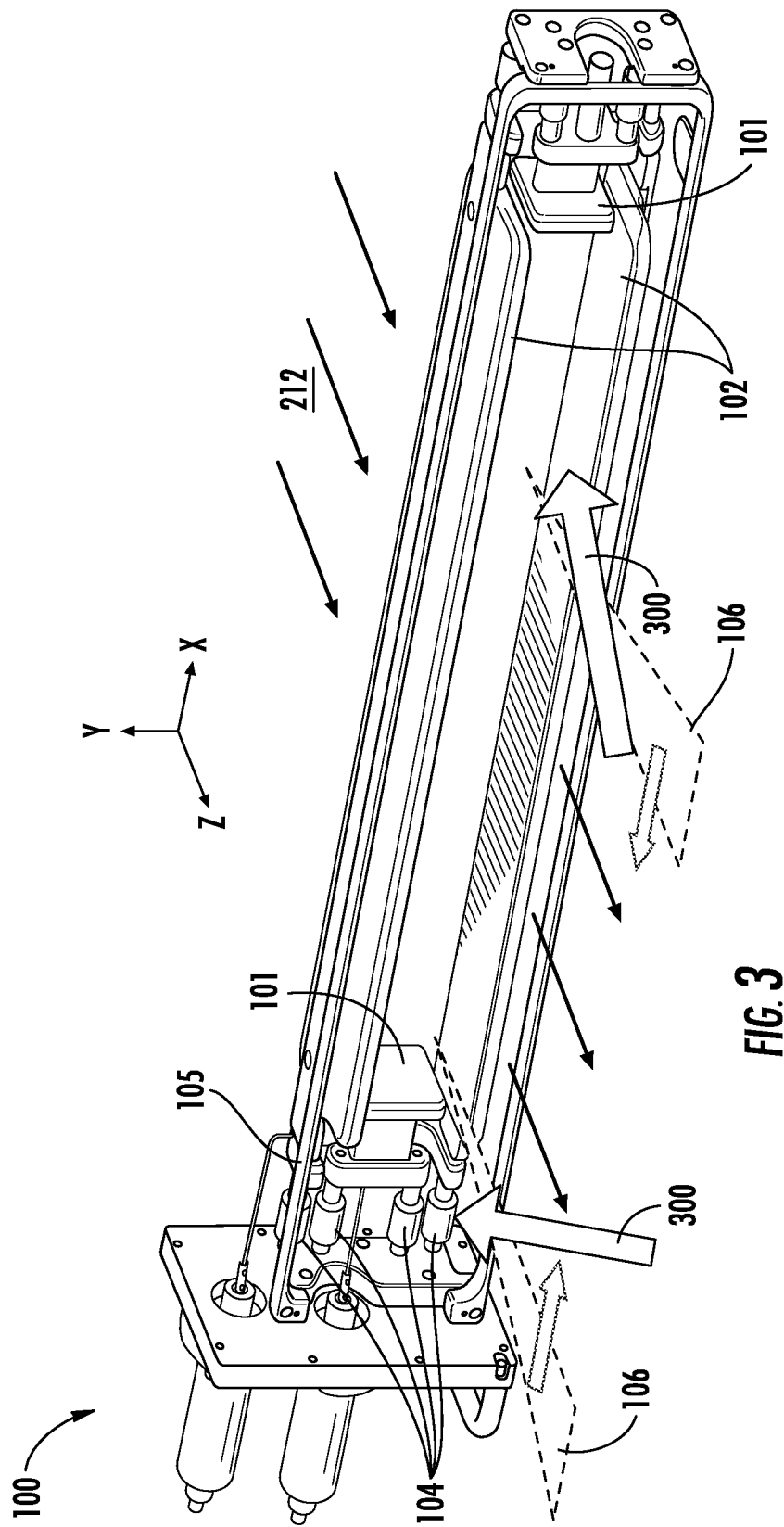
FIG. 3 is a perspective view of the exemplary deceleration lens of FIG. 2 illustrating the presence of back-streaming particles.

FIG. 3 is a perspective view of the deceleration lens 100 of FIG. 2 showing back-streaming particles 300 impinging on various surfaces of the lens. Back-streaming particles 300 may be generated in the end station 211 (FIG. 1) or from any area of the beam-line ion implanter 200 that is exposed to ions. As previously noted, these back-streaming particles 300 are generated when the ion beam hits the wafer or areas of the ion implanter that are exposed to the ion beam. The impact sputters ions and neutral particles off the impact surfaces, causing the particles to stream back toward the deceleration lens. The back-streaming particles 300 may be deposited on any surfaces of the deceleration lens 100 that is exposed to the line-of-sight of the ion ribbon beam 212. Such depositions may cause glitching or high-voltage breakdown of the deceleration lens 100, which, as previously noted can adversely affect dose control and dose uniformity of the implanted species on a target substrate. For example, back-streaming particles 300 may be deposited on surfaces of the lens insulators 104 due to the deceleration of ions in the ribbon beam where the maximum voltage difference is 35 kV for a 3:1 deceleration ratio (such as going from 30 keV to 10 keV). The back-streaming particles 300 also may be deposited on bushing plate 103 (see FIGS. 14 and 15) where the maximum voltage difference across the insulator is 20 kV for a 3:1 deceleration ratio. In one embodiment, the bushing plate may be disposed between the angle corrector magnet 294 (FIG. 1), which may be biased at approximately −20 kV, and the end station 211 at ground potential. Any deposition on an insulating surface may cause a shorter mean time between failures (MTBF) than a specification for a desired implant process. This shorter MTBF may compromise device fabrication and throughput.

Figure 4:
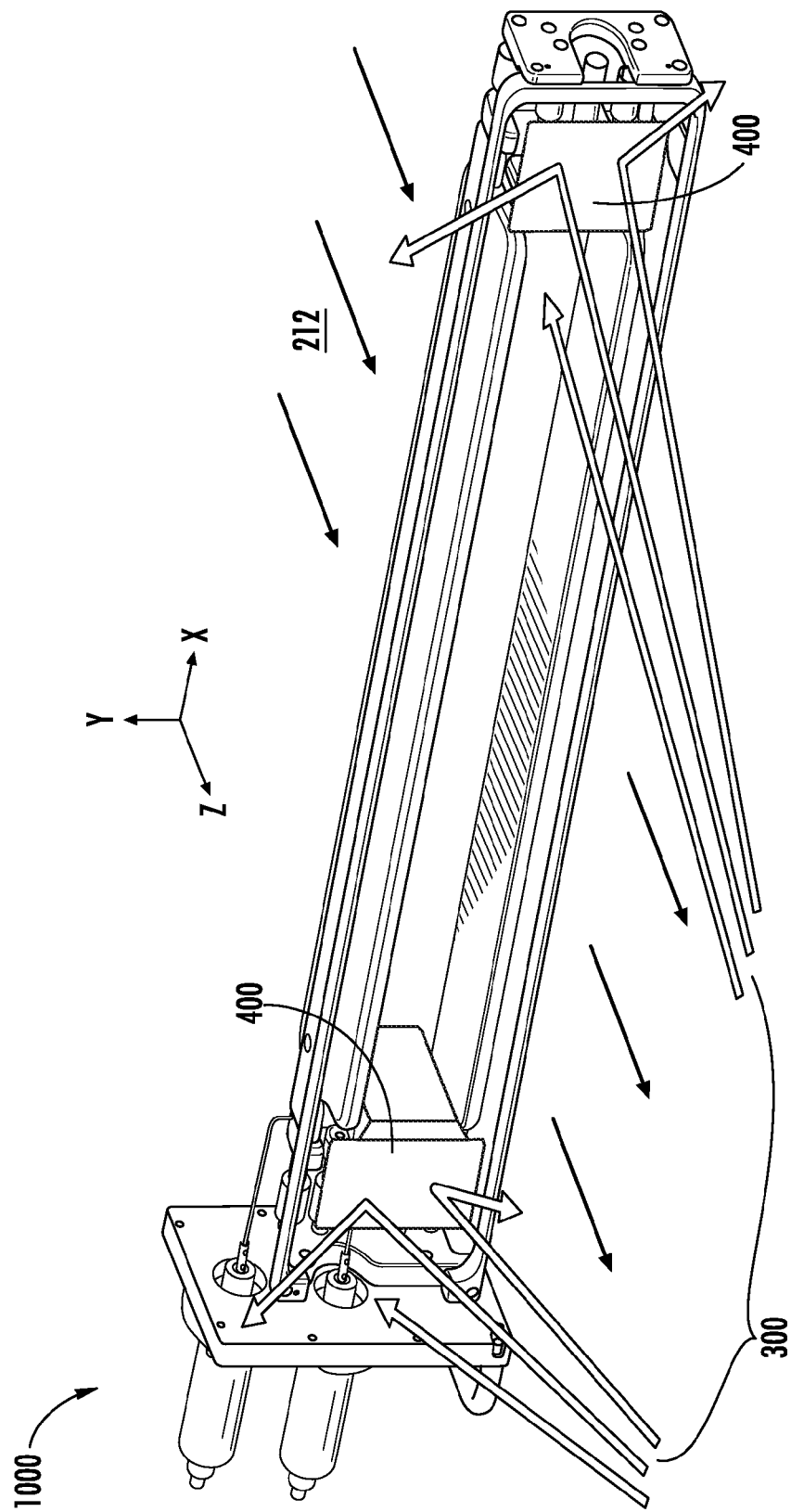
FIG. 4 is a perspective view of an embodiment of a deceleration lens.

FIG. 4 is a perspective view of an embodiment of a deceleration lens 1000 incorporating a deposition protection arrangement. In this embodiment, the deceleration lens 1000 includes L-shaped focus lenses 400 which are configured to shield the insulators 104 (FIG. 3) and bushing 103 (FIGS. 14 and 15) from back-streaming particles 300 while still providing a desired focus along the x axis of the ribbon beam 212. The L-shaped focus lens 400 may be a single continuous piece having first and second portions 410, 420 that are angled with respect to each other. Alternatively, the L-shaped focus lens 400 may be formed from two separate pieces that are joined at an angle. In one embodiment, the first and second portions 410, 420 are oriented at an angle of about 90° with respect to each other. It will be appreciated, however, that other angles may also be used in order to shield the insulators 104 and bushing 103. The size and shape of the first and second portions 410, 420 of the L-shaped focus lens 400 may be optimized to provide maximum protection to the insulators 104 and bushing from back-streaming particles 300. In addition, each L-shaped focus lens 400 may be biased to the same voltage. Alternatively, the L-shaped focus lenses 400 may be biased to different values, depending upon the particular application. In addition, the focus lenses 400 disposed on opposite sides of the deceleration lens 1000 may be biased to the same voltage, or different voltages, as desired to control the shape of the ribbon beam 212.

Figure 5:
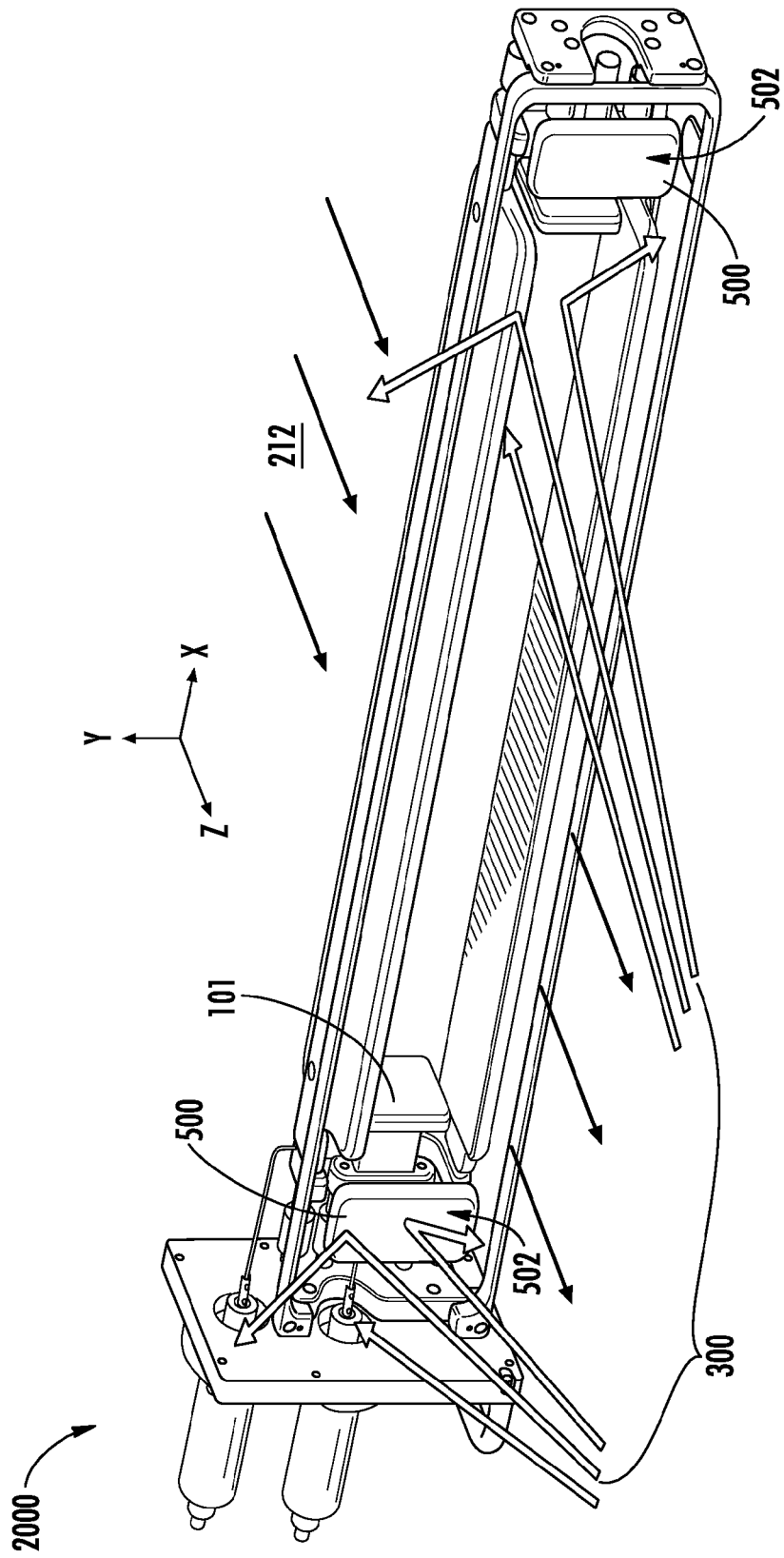
FIG. 5 is a perspective view of a first alternative embodiment of a deceleration lens.

FIG. 5 is a perspective view of a first alternative embodiment of a deceleration lens 2000. The deceleration lens 2000 includes focus lenses 101 and focus shields 500 which are formed and positioned as separate pieces. As can be seen, the focus lenses 101 are angled with respect to the associated focus shields 500. In the illustrated embodiment, the focus lenses 101 are oriented approximately perpendicular to the focus shields 500. Of course, other angles are possible. Focus shields 500 may be positioned downstream (i.e., as measured along the z-direction with respect to the travel of ribbon beam 212) of the focus lenses 100 so that their surfaces 502 can shield the lens insulators and bushing from back-streaming particles 300. The focus shields 500 may also be configured to have an area that is large enough to block back-streaming particles 300, but that is smaller than the overall area of the L-shaped focus lenses 400 of FIG. 4. Providing smaller focus shields 500 may reduce divergence of the ribbon beam 212 which may consequently reduce beam current loss.

Figure 6:
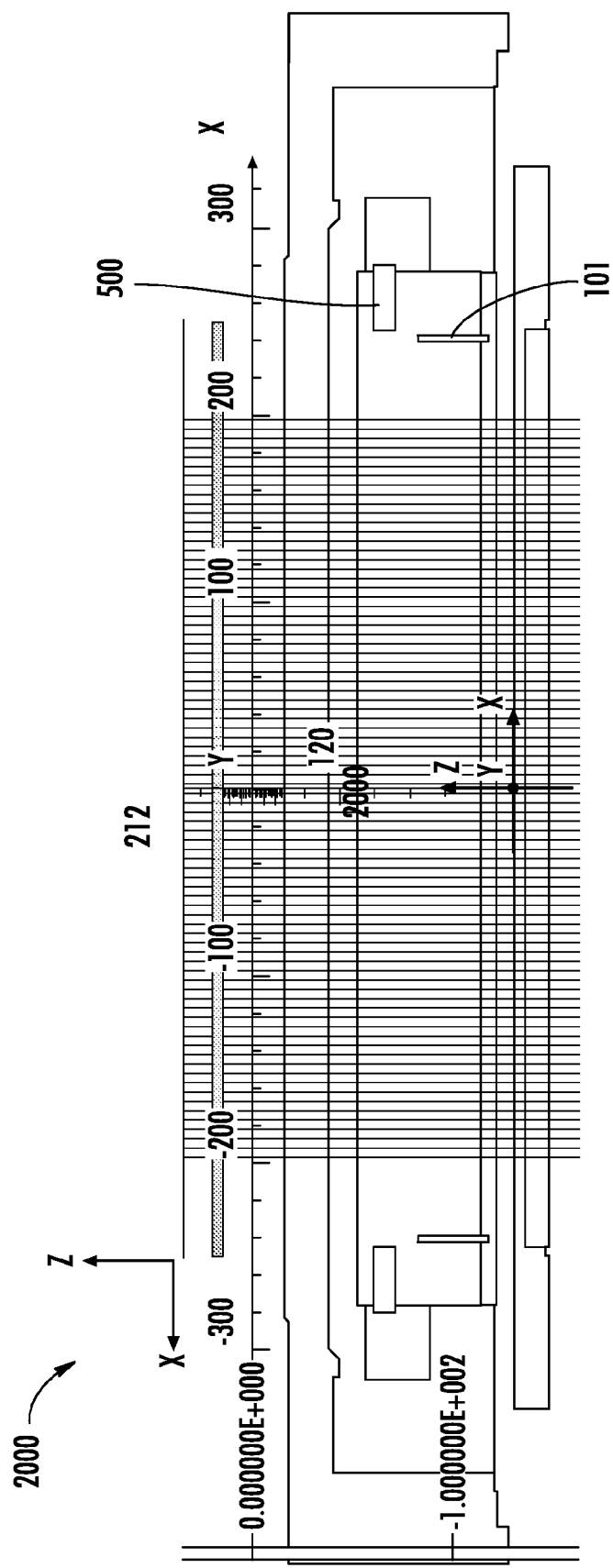
FIG. 6 is a model of the embodiment of FIG. 5.

Since the focus lenses 101 and focus shields 500 are separate pieces, they can be separately biased. In one embodiment the focus shields 500 can be biased at values between the focus lens voltage and ground potential. FIG. 6 is a simulation model of an ion beam propagating through the deceleration lens 2000 of FIG. 5. Specifically, FIG. 6 shows a plan view orientation of the deceleration lens 2000, in which the focus lenses 101 and focus shields 500 are oriented perpendicular with respect to each other, and ribbon beam 212 is shown as a series of stream lines disposed between the focus lenses 101. This model, which was made in Opera, shows that by adjusting the focus shield 500 potential to be unequal to the focus lens 101 potential, divergence of the ribbon beam 212 can be minimized, thus improving transmission, and providing high beam current) through the deceleration lens 100. In one non-limiting example, the focus shields 500 may be grounded and the focus lenses 101 may operate at approximately −4 kV to provide a ribbon beam 212 with reduced x-direction divergence. Alternatively, the focus shields 500 may have a negative voltage applied. In addition, the focus shields 500 disposed on opposite sides of the deceleration lens 2000 may be biased to the same voltage, or different voltages, as desired to control the shape of the ribbon beam 212.

In further embodiments, the focus shields 500 may be adjusted in the z-direction (i.e., along the direction of the ribbon beam 212) to optimize the effective electrostatic field at the lens exit and thus the shape of the beam.

Figure 7:
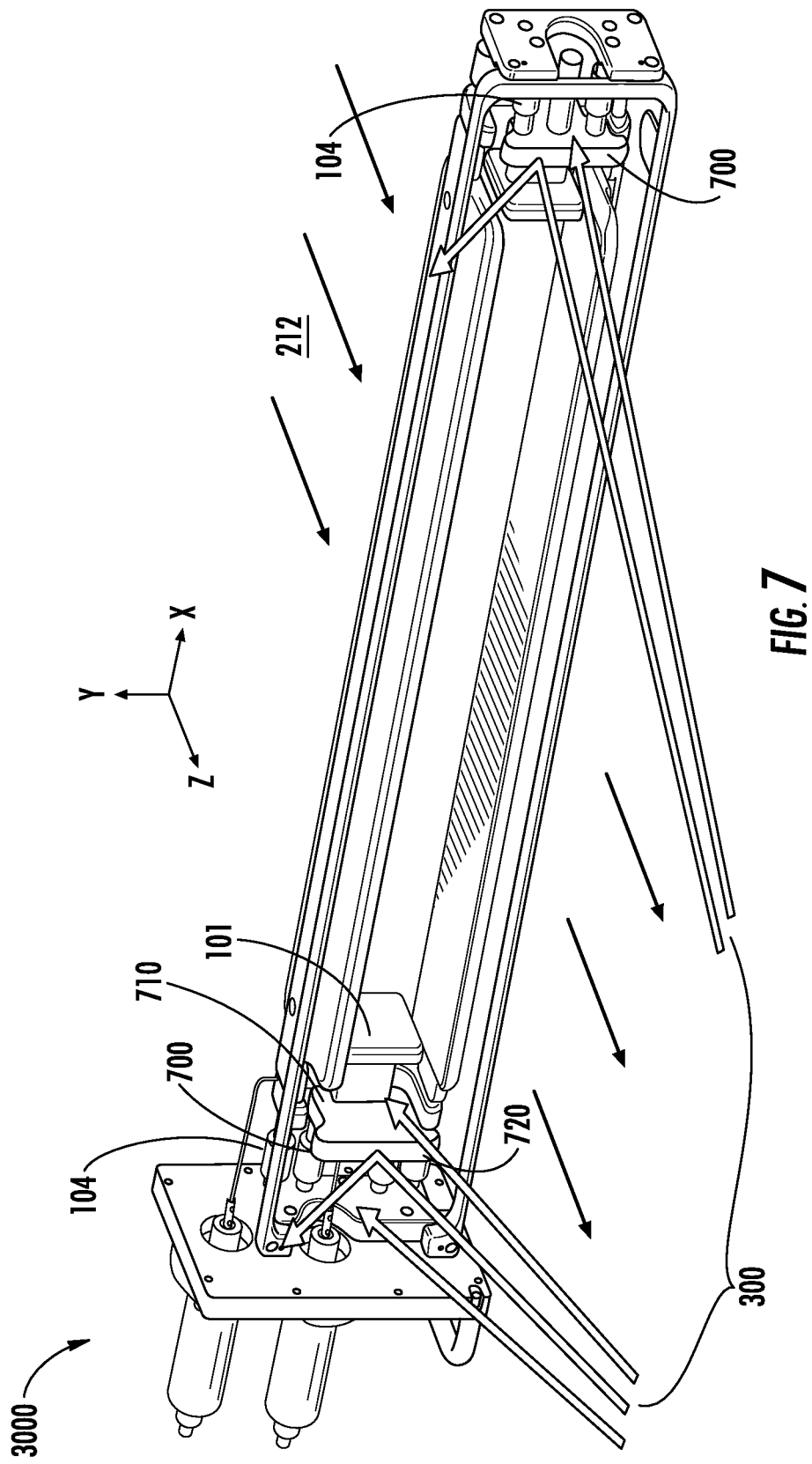
FIG. 7 is a perspective view of a second alternative embodiment of a deceleration lens.

FIG. 7 is a perspective view of an alternative embodiment of a deceleration lens 3000 which includes focus lenses 101 and shaped focus supports 700. The shaped focus supports 700 are configured to have a shape that provides shielding of both the insulators 104 and bushing, but which is spaced further away from the ribbon beam 212 in order to reduce negative effects on beam shape that can be caused by an extended focus lens. The shaped focus supports 700 may include first and second portions 710, 720. The first portion 710 may be substantially rectangular and have "x" and "z" dimensions sufficient to shield a portion of the insulators 104 and bushing from back-streaming particles 300. The second portion 720, which may be positioned closer to the end station 211 than the first portion 710, may have a larger "z" dimension than the first portion 710. This enlarged second portion 720 serves to block particle deposition on the upper insulators 104 that are not shielded by the first portion 710. The enlarged second portion 720 forms a more continuous barrier to shadow the insulators 104 and prevent particle deposition on their surfaces. Without the enlarged second portion 720, the insulators 104 would lie in the direct line of sight to the wafer and would not be protected from backstreaming particles 300.

The shaped focus supports 700 may also be positioned at a greater distance from the ribbon beam 212 (i.e., as measured along the x-axis) than the associated focus lenses 100. In one instance, each shaped focus support 700 is positioned more than about 1.5 inches from the associated focus lens 101. It will be appreciated that this value is merely exemplary, and that other positionings are possible. As with the previous embodiments, the shaped focus supports 700 may be biased at the same potential, or at a different potential, as the focus lenses 101. In addition, the focus supports 700 disposed on opposite sides of the deceleration lens 3000 may be biased to the same voltage, or different voltages, as desired to control the shape of the ribbon beam 212. In one embodiment, the focus supports 700 are unbiased.

Figure 8:
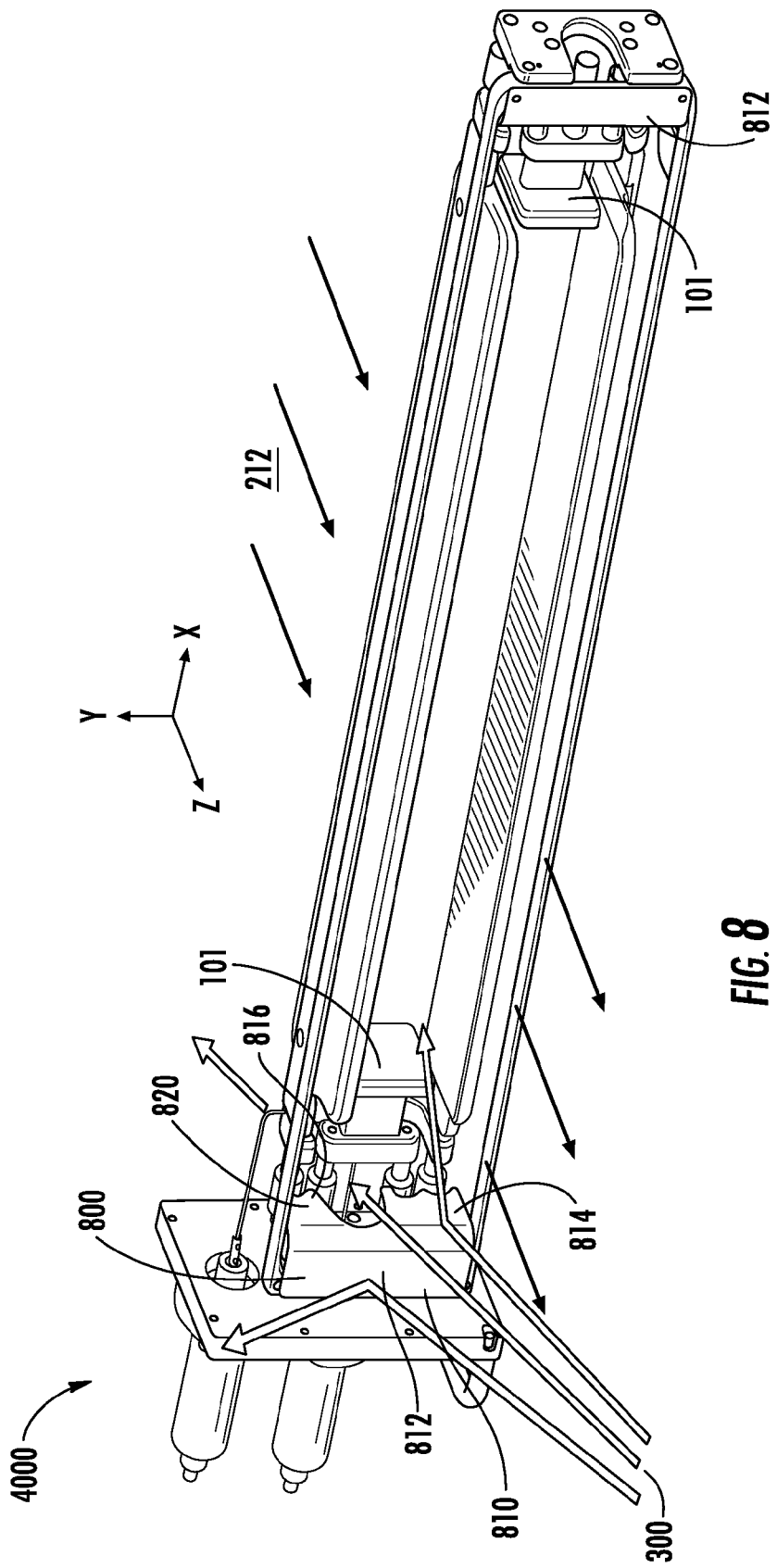
FIG. 8 is a perspective view of a third alternative embodiment of a deceleration lens.

FIG. 8 is a perspective view of a third alternative embodiment of a deceleration lens 4000. In this embodiment, the deceleration lens 4000 includes shaped shields 800 to block a portion of the back-streaming particles 300 from contacting insulator/bushing surfaces. As can be seen, the shaped shields 800 are separate pieces from the associated focus lenses 101.

In the illustrated embodiment, the shaped shields 800 have first and second portions 810, 820 oriented substantially perpendicular with respect to each other. The first portion 810 may have a surface 812 oriented substantially perpendicular to the z-axis, while the second portion 820 may have a surface 814 oriented substantially perpendicular to the x-axis. In addition, the second portion 820 may have a contoured rear edge 816 that closely follows the shape of the individual insulators 104 in order to provide enhanced deposition protection of the insulators. In addition, the rear edge 816 has a scalloped shape that approximates the outer surface of the insulators 104 to which it is adjacent. As described, the surfaces 812, 814 of the shaped shields 800 can effectively shield the lens insulators 104 and bushing from back-streaming particles 300.

The shaped shields 800 may be held at ground potential to reduce any effect on the ribbon beam 212. Alternatively, the shaped shields 800 may be biased at the same, or different, potential as compared to the focus lenses 101. In addition, the shields 800 disposed on opposite sides of the deceleration lens 4000 may be biased to the same voltage, or different voltages, as desired to control the shape of the ribbon beam 212

Figure 9:
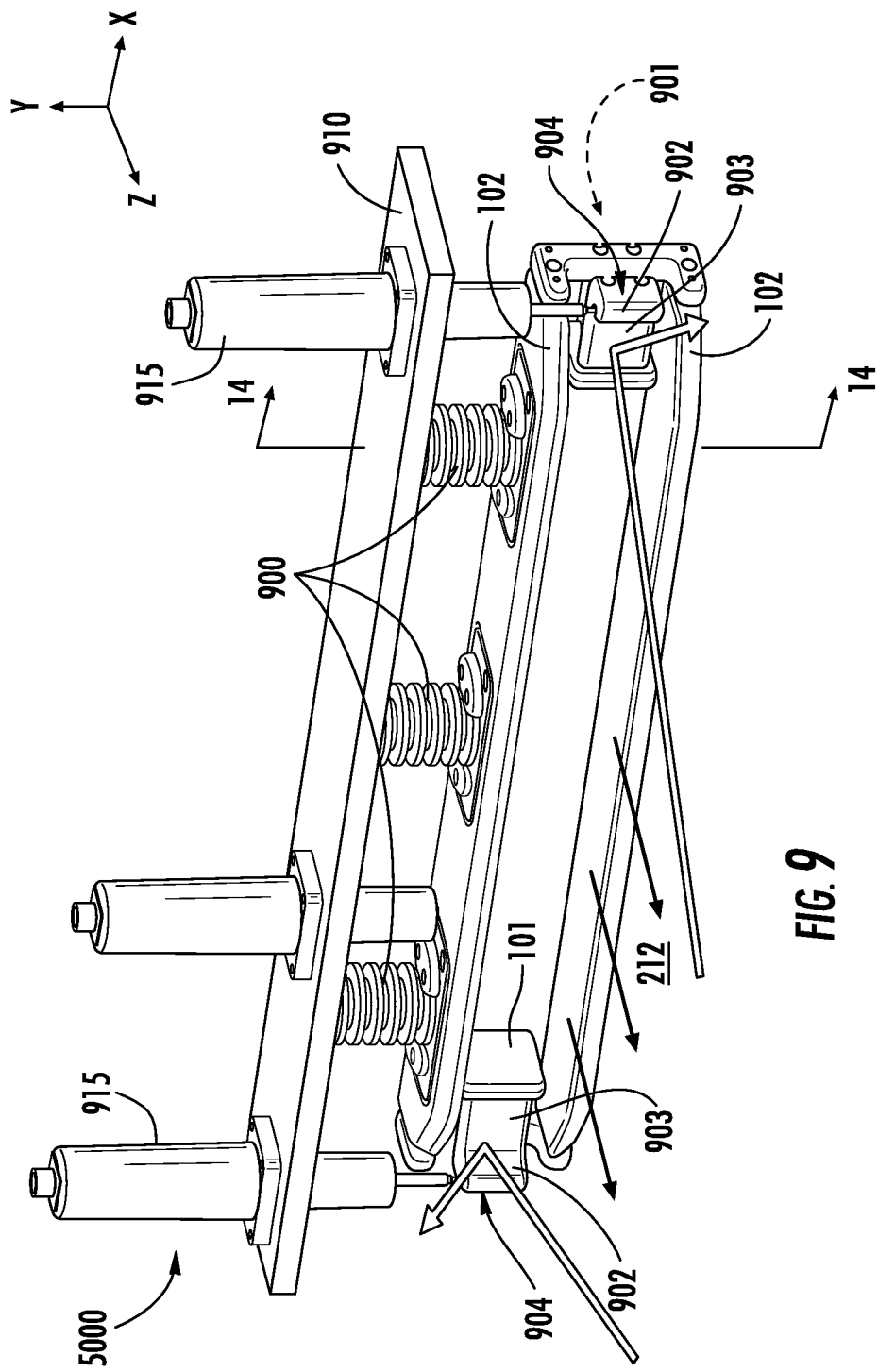
FIG. 9 is a perspective view of a fourth alternative embodiment of a deceleration lens.

FIG. 9 is a perspective view of a fourth alternative embodiment of a deceleration lens 5000. In the illustrated embodiment, the suppression electrodes 102 and focus lenses 101 are supported from above by a plurality of insulators 900 that are directly engaged with the top suppression electrode. The insulators 900 are used to standoff the suppression voltage from ground and to provide a support for the deceleration lens 5000 within the associated vacuum chamber.

The position of the insulators 900 uses the chamber where the deceleration lens 5000 is and the vacuum around the deceleration lens 100 as a shield to reduce back-streaming particles 300 deposition during operation. This can be seen in FIG. 14, in which the deceleration lens exit aperture 905 and the lens chamber 906 serve to shield the insulators from back-streaming particles 300.

In addition, the focus lenses 101 are supported by insulators 901 attached to the suppression electrodes 102 instead of the chamber 906. With the illustrated attachment arrangement, the difference between the focus lens 101 voltage and the suppression electrode 102 voltage is less than the difference to ground. For example, with prior designs in which the insulators are attached to ground, the insulators would need to hold off 45,000 volts. Thus, prior insulators are susceptible to high voltage breakdown due to the very large potential that exists between the two objects. With the FIG. 14 design, however, the insulators 901 that support the focus lenses 101 are attached to the suppression electrodes 102 and thus, the insulators only need to standoff the difference between suppression and focus voltages (typically 10,000 volts). This allows the use of smaller insulators 900, 901 than would be required with prior attachment schemes, and also reduces the number of regions that are susceptible to high voltage breakdown. Thus, the FIG. 14 configuration reduces the cost of the insulators, while also reducing their susceptibility to breakdown.

The deceleration lens 5000 may also include focus shields 902 for the focus lenses 101 to reduce impingement of back-streaming particles on the lens insulators 901, thus improving lifetime performance. As with previous embodiments, focus shields 902 may have a surface 903 oriented substantially perpendicular to the z-axis to shield the lens insulators 901 from back-streaming particles 300. In the illustrated embodiment, focus shields 902 also have a second portion 904 that enables the focus shields 902 to be supported from the lid 910 above via one or more supports 915. The FIG. 14 arrangement of the focus lenses 101, focus shields 902 and insulators 901 allows for the connection of the high voltage feedthrough and support for the focus components from the top of the deceleration lens 5000 in lieu of the side.

The embodiment of FIG. 9 also reduces the number of components and may provide extra insulation length without changing the overall footprint of the deceleration lens 5000. Maintenance and cost may be reduced using a version of this embodiment.

Figure 10:
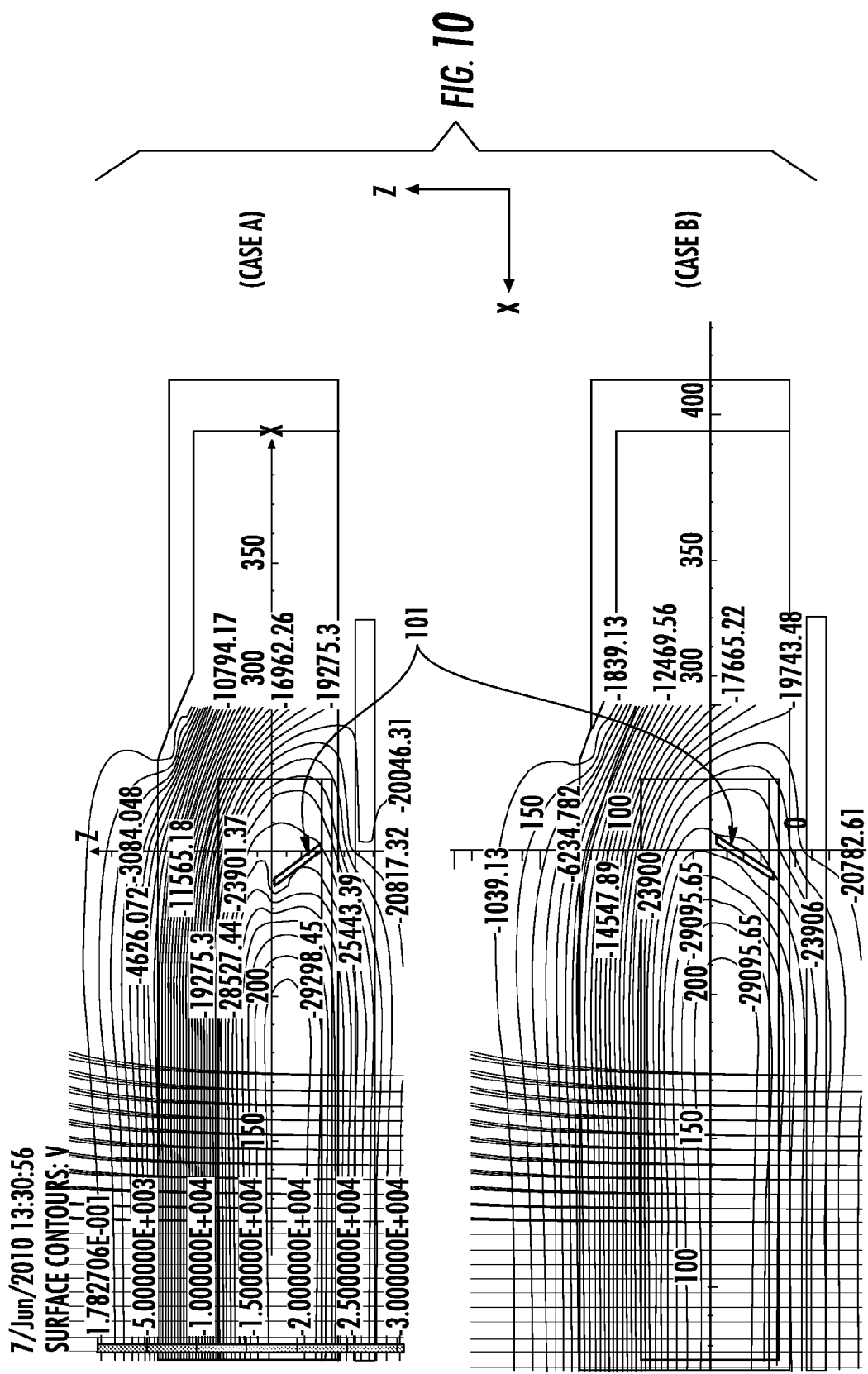
FIGS. 10A-B are models of a fifth alternative embodiment of a deceleration lens.

FIGS. 10A and 10B are perspective views of a fifth alternative embodiment of a deceleration lens in which the focus lens 101 is tilted in the x-z plane. Thus, a front surface 101A of the focus lens 101 forms an angle φ with respect to the x-axis (see FIG. 12), where the z-axis is aligned with the direction of the ribbon beam 212. In one embodiment, the focus lens is adjustable to position the electrode surfaces at an angle of from about 0 to about 70 degrees with respect to the direction of the ribbon beam 212.

It will be appreciated that this tilted-focus lens arrangement can be implemented in any of the deceleration lens arrangements of FIGS. 2-9. To simplify the design, the focus lenses 101 may share a single power supply or may attach to the power supply for the suppression electrode 102 via a voltage divider. In one embodiment, the tilted focus lens 101 could be statically mounted to existing supports, or it could include a dynamic mechanism used to tune the ion beam 212. To achieve dynamic motion, the insulators between the focus elements and the suppression buss bar are removed and the assembly is supported by the high voltage feedthrough assembly shaft. As will be appreciated, moving the insulators removes the constraint on the focus element allowing it to move with the high voltage feedthrough.

Figure 11B:
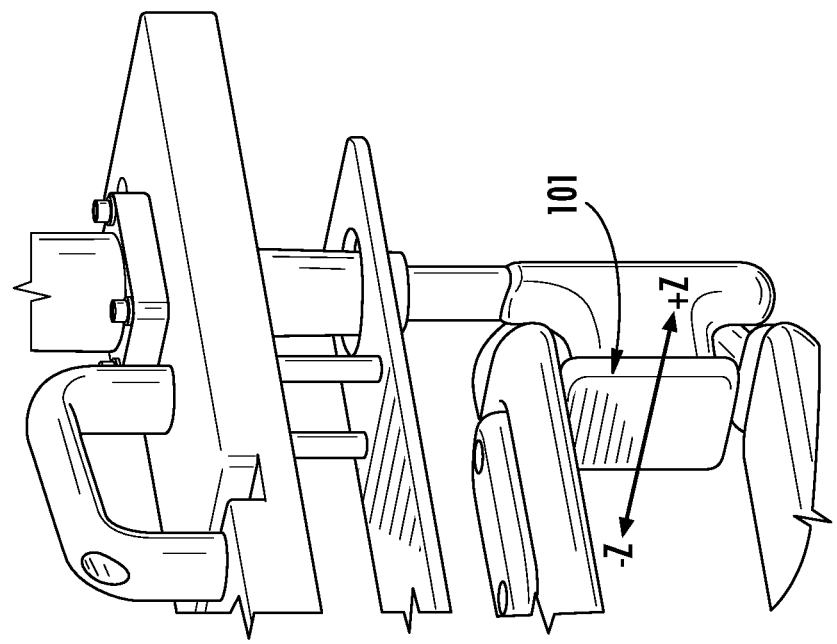
FIG. 11B is a partial perspective view of a deceleration lens including a lens translation feature.
Figure 11A:
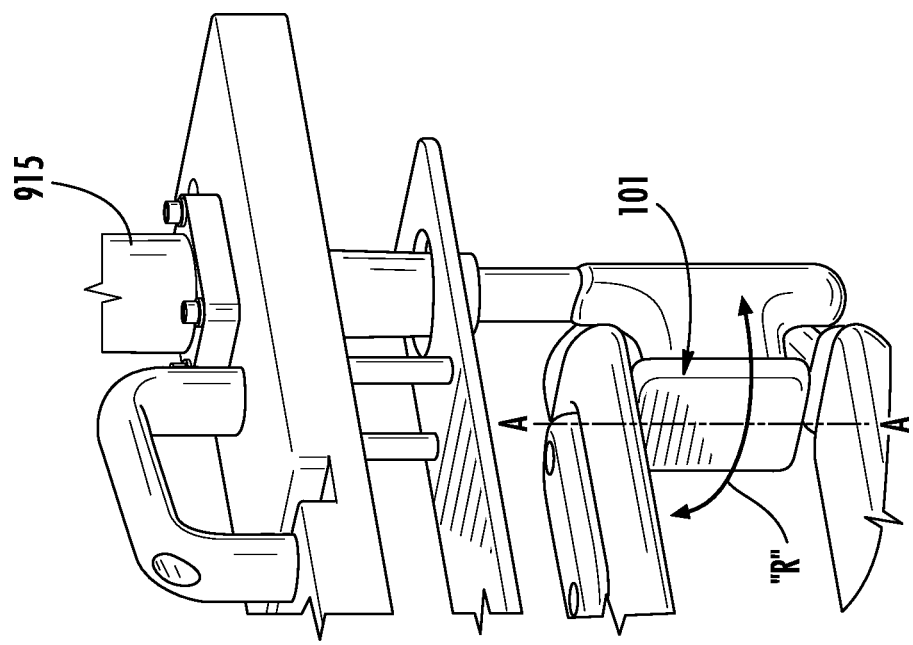
FIG. 11A is a partial perspective view of a deceleration lens including a lens tilt feature.

As shown in FIG. 11A, to tilt the focus lens 101 by a specific angle (φ-angle, FIG. 12), the feedthrough assembly, with focus lens 101 attached, is rotated by a specific angle. In one embodiment, the focus lens 101 rotates (as shown by arrow "R") about an axis "A-A" that is the same as, or parallel to, the axis of the support 915, creating the φ-angle for the tilted focus lens embodiment of FIGS. 10A and 10B. The feedthrough support 915 can be supported by bearings to allow rotational motion, and appropriate seals can be used to prevent leaks into the vacuum chamber. Rotational motion can be imparted, for example, by a solenoid valve.

In addition, imparting a linear motion in the "z" direction (see FIG. 11B) would also further increase beam tuning capability. A linear motion device, such as a solenoid stepper, can be positioned on or adjacent to the focus lens 101 or support 915 to move the focus lens 101 up or down the beam transmission axis (i.e., the z-axis) allowing the operator to tune the position of the focus lens 101 for optimal beam performance. Many types of linear motion devices (such as the aforementioned solenoid stepper) exist that provide constrained linear motion in a desired direction and when combined with the appropriate seal technology provide linear motion into the vacuum chamber environment. The ability to tilt and change the "z" location of the focus lens could be combined in the deceleration lens for improved tuning capability and beam performance.

Figure 12:
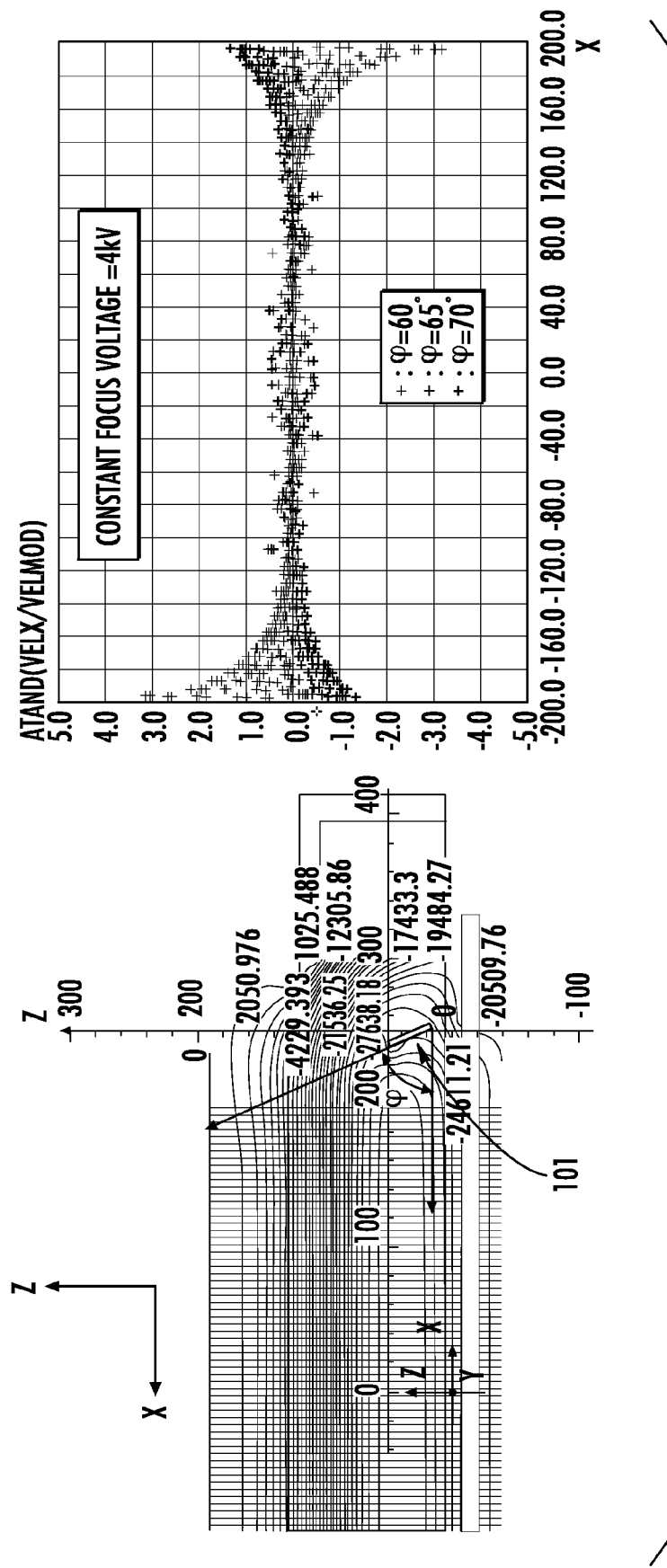
FIG. 12 is a model comparison of angle distributions compared to $\phi$-angle in relation to the embodiment of FIGS. 10A-B.

FIG. 12 is a comparison of angle distributions compared to φ-angle for the tilted focus lens embodiment of FIGS. 10A and 10B. Three horizontal angle distributions for three different φ-angles are compared. By changing the φ-angle from $6^{0o}$ to $6^{5o}$ to $7^{0o}$, the beam spread goes from converging to parallel to diverging. The geometry of the focus lenses and the φ-angle are consistent with the Pierce Method. Consequently, the shape and angle of the focus lenses 101 may be adjusted to produce a parallel ribbon beam. Of course, other φ-angles are possible to optimize the ribbon beam.

Figure 13:
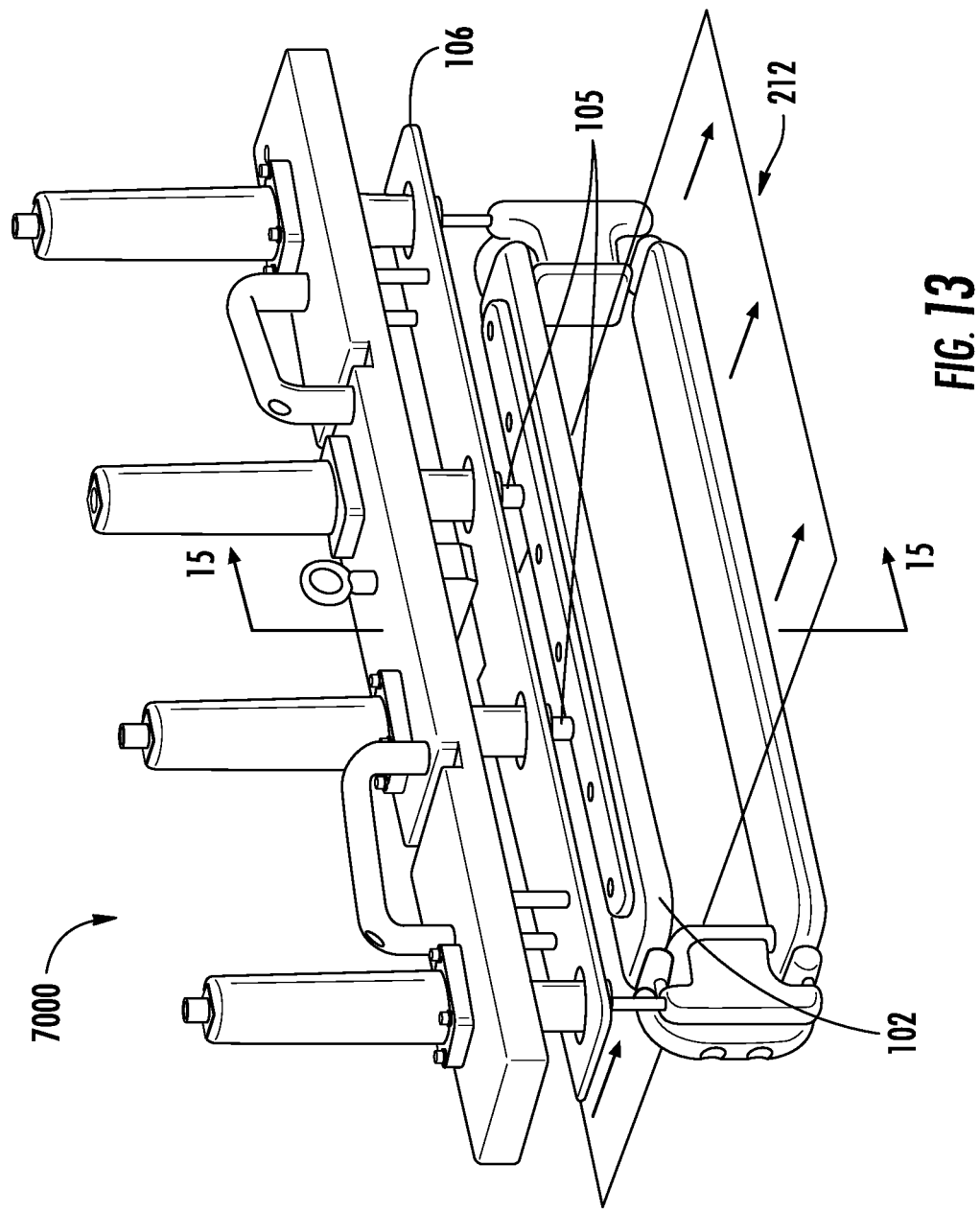
FIG. 13 is a perspective view of a sixth alternative embodiment of a deceleration lens.

FIG. 13 is a perspective view of a sixth alternative embodiment of a deceleration lens 7000. Lens 7000 is similar to the lens 5000 described in relation to FIG. 9. Deceleration lens 7000, however, is supported by the high voltage feedthrough supports 105, which eliminate the need for additional insulators (i.e., insulators 900 in FIG. 9) between the suppression electrode 102 and ground. The feedthrough supports 105 provide mechanical support for the deceleration lens 7000, while also providing high voltage electrical connections to the deceleration lens 7000.

As will be appreciated, eliminating the additional insulator supports reduces the number of surfaces upon which backstreaming particles can impinge, which thereby reduces the number of potential paths for electrical breakdown. An electrically-conductive feedthrough shield 106 is added between the path of the ribbon ion beam 212 and the regions above the feedthrough shield 106. The feedthrough shield 106 can be supported by standoffs from the base and the walls of the surrounding vacuum chamber. This feedthrough shield 106, as the name suggests, acts as a shield to help prevent deposits on the components located above it. In one exemplary, non-limiting embodiment, the feedthrough shield 106 operates at ground potential and provides ground plane symmetry around the high voltage suppression components.

As compared to the embodiment of FIG. 9, the deceleration capability of lens 7000 is increased, the suppression and focus capability is increased, and the mean time between services (MTBS) may be improved. For example, eliminating the suppression electrode support insulators reduces the total number of paths to ground, which will improve MTBS. The feedthroughs provide requisite support for the suppression electrode and lens assembly, while also providing superior shielding and higher standoff capacity than the support insulators in terms of tracking length between suppression and ground.

Figure 14:
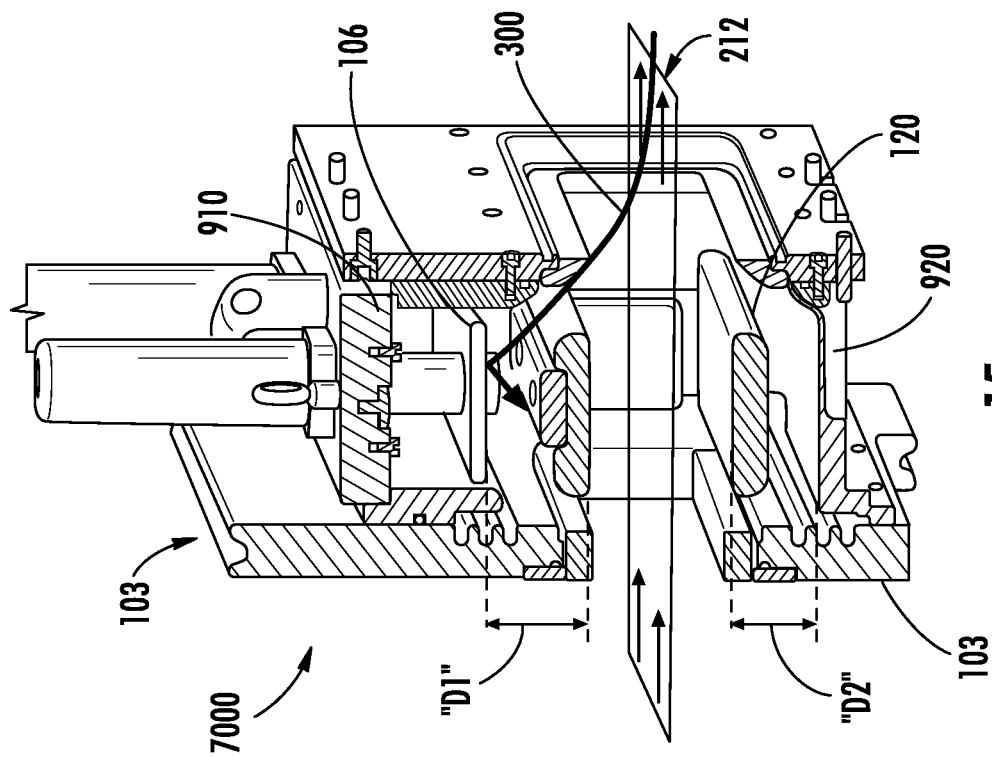
FIG. 14 is a cross-section view of the deceleration lens of FIG. 9, taken along line 14-14.
Figure 15:
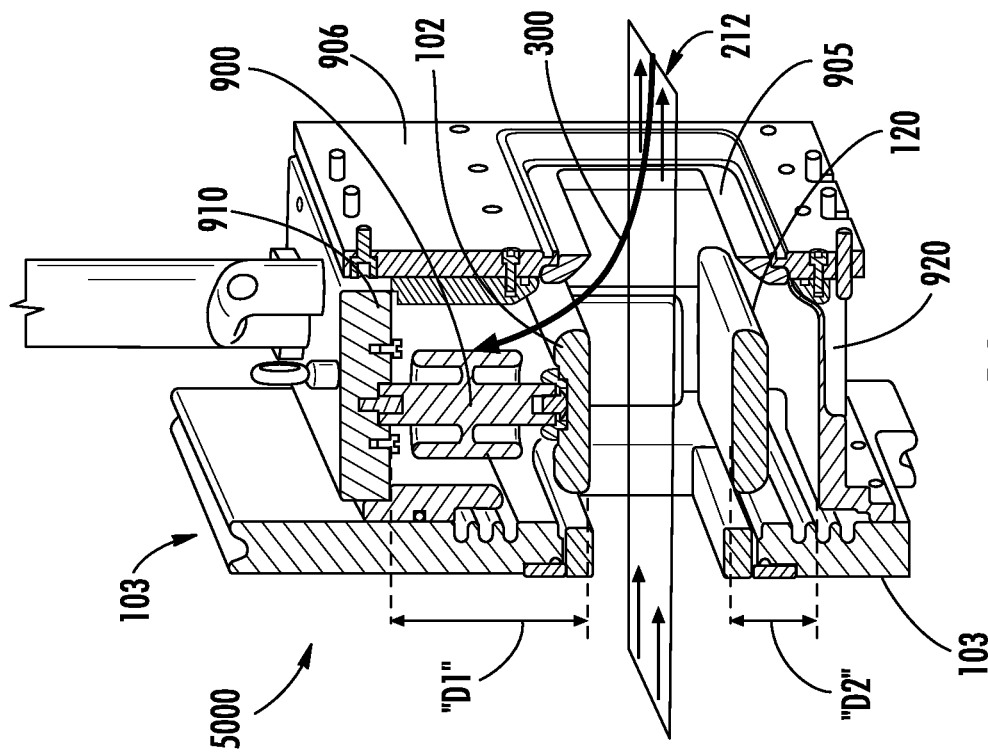
FIG. 15 is a cross-sectional view of the deceleration lens of FIG. 13, taken along line 15-15.

FIG. 14 is a cross-sectional view of the deceleration lens of FIG. 9, while FIG. 15 is a cross-sectional view of the deceleration lens of FIG. 13. FIG. 14 shows that the distance "D1" between the lens lid 910 and the ribbon ion beam 212 is greater than the distance "D2" between the lens' bottom floor 920 and the beam 212 (i.e., the arrangement is not symmetrical). In the embodiment of FIG. 15, the feedthrough shield 106 and bottom floor 920 are symmetrically disposed around the ribbon ion beam 212. Since the feedthrough shield 106 is at ground potential, this arrangement results in symmetric potential lines around the ribbon beam 212, since the ground plane on top and bottom are the same distance from the ribbon ion beam 212. Such symmetry can result in improved quality of the ribbon ion beam 212.

The deceleration lens 7000 of FIGS. 13 and 15 were modeled at 30 kV deceleration voltage and 25 kV suppression and ground voltages, making a maximum of 55 kV between the suppression and ground electrodes. While a higher voltage was simulated with the deceleration lens 7000 of FIG. 13 as compared to other deceleration lens designs, a lower electrostatic stress was shown. In addition, a lower glitching rate in the ribbon ion beam 212 also has been demonstrated compared to previous deceleration lens designs. Furthermore, the disclosed lens design enables transport of very high current beams where space charge effects dominate. In one example, ~100 mA of beam current was successfully transported to the wafer using the disclosed arrangement).

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A deceleration lens for use in an ion implanter, comprising:
    a suppression electrode comprising an upper portion and a lower portion, the upper and lower portions disposed such that an ion beam is transmitted therebetween;
    first and second focus electrodes positioned between the upper and lower portions of the suppression electrode, the first and second focus electrodes disposed such that the ion beam is transmitted therebetween; and
    first and second shields, the first shield disposed between the first focus electrode and an end station of the ion implanter, the second shield disposed between the second focus electrode and the end station of the ion implanter;
    wherein the first and second shields protect support surfaces of said first and second focus electrodes from deposition of back-streaming particles generated from said ion beam and wherein a bias of each of the first and second shields is configured to control a shape of the ion beam.

2. The deceleration lens of claim 1, wherein the first and second shields have shielding surfaces oriented perpendicular to a direction of the ion beam, and the first and second focus electrodes have electrode surfaces oriented perpendicular to the shielding surfaces.

3. The deceleration lens of claim 1, wherein the first and second focus electrodes are supported by insulators, and the first and second shields are positioned to shield the insulators from the back-streaming particles.

4. The deceleration lens of claim 1, wherein the first focus electrode and the first shield are a single piece, and the second focus electrode and the second shield are a single piece.

5. The deceleration lens of claim 1, wherein the first and second shields are positioned a first distance from respective first and second sides of the ion beam, and the first and second focus electrodes are positioned a second distance from the respective first and second sides of the ion beam, the first distance being greater than the second distance.

6. The deceleration lens of claim 1, wherein the first and second shields are L-shaped, each of the first and second shields having a first shield surface oriented perpendicular to a surface of the first and second focus electrodes, each of the first and second shields having a second shield surface oriented parallel to the surface of the first and second focus electrodes.

7. The deceleration lens of claim 1, wherein the suppression electrode is supported by a plurality of insulators, the insulators configured to standoff a suppression voltage from ground.

8. The deceleration lens of claim 7, wherein the first and second focus lenses are supported by insulators attached to the suppression electrode.

9. The deceleration lens of claim 1, wherein the first and second focus electrodes have electrode surfaces facing said ion beam, the first and second focus electrodes being adjustable so that the electrode surfaces form an oblique angle with respect to a direction of the ion beam.

10. The deceleration lens of claim 1, wherein the suppression electrode is supported by a plurality of high voltage feedthrough supports, the deceleration lens further comprising a conductive feedthrough sheath disposed between the suppression electrode and an upper portion of the deceleration lens, the feedthrough shield being supported by standoffs from a surrounding vacuum chamber.

11. The deceleration lens of claim 10, wherein the feedthrough shield operates at wound potential and provides ground plane symmetry about the ion beam.

12. The deceleration lens of claim 1, wherein the suppression electrode is biased at a different voltage than the first and second focus electrodes.

13. A deceleration lens for use in an ion implanter, comprising:
    a suppression electrode having upper and lower portions positioned to enable an ion beam to be transmitted therebetween;
    first and second focus electrodes positioned between the upper and lower portions of the suppression electrode, the first and second focus electrodes positioned to enable the ion beam to be transmitted therebetween, the first and second focus electrodes each having electrode surfaces facing the ion beam; and
    a conductive feedthrough sheath disposed between the suppression electrode and an upper portion of the deceleration lens, the conductive feedthrough sheath being supported by standoffs from a surrounding vacuum chamber;
    wherein the first and second focus electrodes are supported by insulators attached to the suppression electrode;
    wherein the suppression electrode is supported by a plurality of high voltage feedthrough supports engaged with a lid portion of the deceleration lens; and
    wherein the feedthrough sheath operates at wound potential and provides ground plane symmetry about the ion beam.

14. The deceleration lens of claim 13, wherein the ion beam is a ribbon beam, wherein the first second focus electrodes are adjustable to enable the electrode surfaces to form an oblique angle with respect to a transmission direction of the ion beam, and adjustment of the first and second focus electrodes enables adjustment of a parallelism aspect of the ribbon beam.

15. The deceleration lens of claim 13, wherein the first and second focus electrodes are adjustable to position the electrode surfaces at an angle of from about 0 to about 70 degrees with respect to a direction of the ion beam.

16. The deceleration lens of claim 13, further comprising:
first and second shields, the first shield disposed between the first focus electrode and an end station of the ion implanter, the second shield disposed between the second focus electrode and the end station of the ion implanter;
wherein the first and second shields protect insulator support surfaces of said first and second focus electrodes from deposition of back-streaming particles generated from the ion beam.

17. The deceleration lens of claim 16, wherein the first and second shields are positioned a first distance from respective first and second sides of the ion beam, and the first and second focus electrodes are positioned a second distance from the respective first and second sides of the ion beam, the first distance being greater than the second distance.

18. The deceleration lens of claim 16, wherein the first and second shields are L-shaped.

19. The deceleration lens of claim 13, wherein the suppression electrode is supported by a plurality of insulators, the insulators configured to standoff a suppression voltage from ground.

20. The deceleration lens of claim 1, wherein the first and second focus electrodes are biased at a different voltage than the first and second shields.

* * * * *